(12) United States Patent
Yoshihara et al.

(10) Patent No.: US 6,995,466 B2
(45) Date of Patent: Feb. 7, 2006

(54) SEMICONDUCTOR DEVICE HAVING PASSIVATION CAP AND METHOD FOR MANUFACTURING THE SAME

(75) Inventors: Shinji Yoshihara, Nagoya (JP); Yasutoshi Suzuki, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/732,377

(22) Filed: Dec. 11, 2003

(65) Prior Publication Data
US 2004/0140534 A1    Jul. 22, 2004

(30) Foreign Application Priority Data
Dec. 12, 2002  (JP) .............................. 2002-360598

(51) Int. Cl.
*H01L 23/12* (2006.01)
(52) U.S. Cl. ....................................... 257/704; 257/714
(58) Field of Classification Search ................ 257/704, 257/714, 700, 678, 620
See application file for complete search history.

(56) References Cited

U.S. PATENT DOCUMENTS

| 5,824,177 A | 10/1998 | Yoshihara et al. |
| 5,902,499 A | 5/1999 | Richerzhagen |
| 6,245,593 B1 | 6/2001 | Yoshihara et al. |

FOREIGN PATENT DOCUMENTS

| JP | A-H11-251266 | 9/1999 |
| JP | A-2001-176820 | 6/2001 |
| JP | A-2002-100590 | 4/2002 |

*Primary Examiner*—Roy Potter
(74) *Attorney, Agent, or Firm*—Posz Law Group, PLC

(57) ABSTRACT

A semiconductor device includes a semiconductor wafer having a weak portion and a removable passivation cap disposed on the wafer for covering the weak portion. The passivation cap has an absorption coefficient of a laser beam, which is smaller than that of the wafer. The cap has a capability of passing water therethrough. In a case where the device is diced and cut into a plurality of chips, the passivation cap can be removed easily without bonding the cap again. That is because the passivation cap remains one body after dicing.

20 Claims, 7 Drawing Sheets

SEMICONDUCTOR DEVICE HAVING PASSIVATION CAP AND METHOD FOR MANUFACTURING THE SAME

CROSS REFERENCE TO RELATED APPLICATION

This application is based on Japanese Patent Application No. 2002-360598 filed on Dec. 12, 2002, the disclosure of which is incorporated herein by reference.

FIELD OF THE INVENTION

The present invention relates to a semiconductor device having a passivation cap and a method for manufacturing the same.

BACKGROUND OF THE INVENTION

A method for dividing silicon wafer having a plurality of semiconductor chips into individual chips is such that the silicon wafer disposed on an adhesion sheet is diced, i.e., cut with using dicing cutter equipment having a dicing blade. At this time, a large amount of water jets toward the wafer so that heat generated by cutting the wafer is removed and radiated from the wafer to the water, a silicon chippage is flown and removed with the water, or the dicing blade is subsidized with the water.

Further, another dicing method is disclosed in Japanese Patent Application Publication No. 2001-176820. This method is used with a laser beam, which is irradiated on a silicon wafer so that the wafer is diced. At this time, cooling water is jetting on the wafer. However, a functional element, i.e., a semiconductor sensor, disposed on the wafer may be destroyed with the pressure of the cooling water or the surface tension of the cooling water, so that the device does not work correctly. Specifically, when the sensor is, for example, a capacitance type acceleration sensor, which has a movable portion, or the sensor has an air bridge wiring structure with an exposed member, which has weak mechanical strength and is exposed outside, the sensor may be destroyed easily.

In view of the above problem, further another dicing method is disclosed in Japanese Patent Application Publication No. 2000-223446. This method is used with a passivation cap disposed on a semiconductor wafer. The wafer with the passivation cap is diced, i.e., cut. The passivation cap protects the sensor from cooling water or dicing water, and is an adhesion sheet made of ultraviolet (i.e., UV) curable material. However, when the wafer with the passivation cap is cut and diced, the wafer is divided into a plurality of chips together with the passivation cap disposed on each chip. Therefore, after dicing, the passivation cap has to be removed from the chip individually. This process is necessitated to have much time and additional cost. Accordingly, each passivation cap on the chip is bonded together after dicing, so that each passivation cap is formed into a sheet again. Then, the passivation cap, i.e., the sheet is removed from the chip. However, this bonding process is necessitated to have much time and additional cost.

SUMMARY OF THE INVENTION

In view of the above problem, it is an object of the present invention to provide a semiconductor device having a plurality of chips with a movable portion or an exposed portion on a wafer and having a removable passivation cap for protecting the movable portion or the exposed portion.

It is another object of the present invention to provide a method for manufacturing a semiconductor device having a plurality of chips with a movable portion or an exposed portion on a wafer and having a removable passivation cap for protecting the movable portion or the exposed portion. Specifically, the method has no bonding process for bonding each passivation cap after dicing.

A semiconductor device includes a semiconductor wafer having a weak portion and a removable passivation cap disposed on the wafer for covering the weak portion. The passivation cap has an absorption coefficient of a laser beam, which is smaller than that of the wafer. The cap has a capability of passing water therethrough. In a case where the device is diced and cut into a plurality of chips, the passivation cap can be removed easily without bonding the cap again. That is because the passivation cap remains one body after dicing.

Preferably, the weak portion includes a movable portion or an exposed portion, and the cap has a mesh structure so that pressure of water after passing through the cap is smaller than that before passing through the cap in a case where the water jets on the wafer with the cap.

Preferably, the passivation cap includes a base sheet and an adhesion sheet. The base sheet has the absorption coefficient of the laser beam, which is smaller than that of the wafer, and has the mesh structure. The adhesion sheet has both sides, one side being adhered to the base sheet and the other side being adhered to the wafer.

Preferably, the wafer includes a plurality of chips, each of which includes the weak portion, and has a predetermined size. The opening has another predetermined size, which is equal to or smaller than the size of the chip. The wafer further includes a dicing cut portion having further another predetermined size, which is equal to or smaller than the size of the opening.

Preferably, the base sheet is a flat plate, and the adhesion sheet has a portion, which faces the weak portion and has a small adhesive force so that the adhesive force of the portion is smaller than that of the other portion of the adhesion sheet.

Further, a method for manufacturing a semiconductor device is provided. The method includes the steps of preparing a semiconductor wafer having a weak portion, forming a passivation cap on a surface of the wafer for covering the weak portion, and cutting the wafer into a plurality of chips with a laser beam irradiation together with jetting water to the surface of the wafer. The passivation cap has an absorption coefficient of a laser beam, which is smaller than that of the wafer. The cap has a capability of passing water therethrough. In the step of cutting the device into a plurality of chips, the passivation cap can be removed easily without bonding the cap again. That is because the passivation cap remains one body after dicing.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1A:
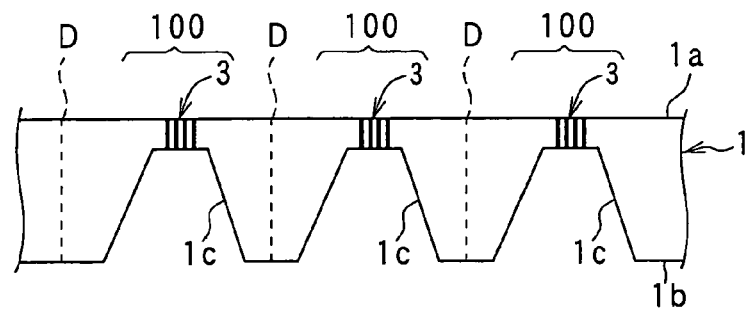
FIGS. 1A–4 are cross-sectional views explaining a method for manufacturing a semiconductor device according to a first embodiment of the present invention.

A semiconductor device 200 according to a first embodiment of the present invention is manufactured with the following process shown in FIGS. 1A–5. The device 200 has a plurality of chips 100 with a movable portion or an exposed portion on a wafer 1 and a removable passivation cap for protecting the movable portion or the exposed portion. The chip 100 is, for example, an acceleration sensor 100.

The passivation cap protects the chip 100 in a case where the device 200 is diced and divided into the chips 100 or in a case where the divided chip 100 is carried in a manufacturing process. Therefore, the device 200 can be easily treated during the manufacturing process. For example, before dicing the device 200, the passivation cap protects the device 100 from being contaminated with a contamination, being mixed with a foreign matter, or being damaged. Further, after dicing the device 200, the divided chip 100 having the passivation cap can be protected with the passivation cap.

1. First Bonding Process

Figure 1B:
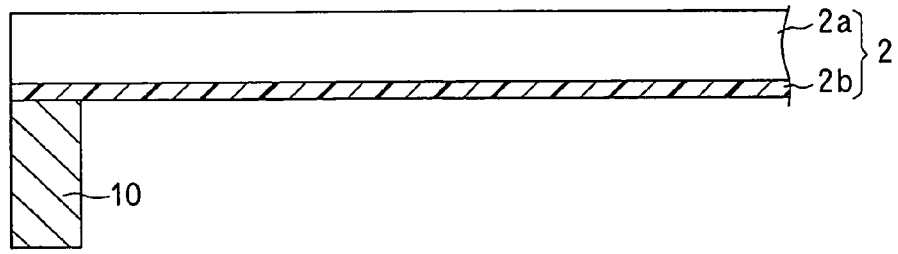

At first, a semiconductor wafer 1 having a plurality of acceleration sensors 100 and the first adhesion sheet 2 are prepared, as shown in FIGS. 1A and 1B. The acceleration sensor 100 is formed on the wafer 1 with using a micro-machining method, which is a well-known method and uses a conventional semiconductor manufacturing process.

The acceleration sensor 100 has a sensing portion 3 (i.e., a capacitance detection electrode portion), which has a membrane structure and a comb-teeth shape. Specifically, the sensing portion 3 is a capacitance type detector having a movable portion, i.e., a movable electrode, and a fixed electrode. Therefore, the sensing portion 3 is disposed and exposed on a foreside surface 1a of the wafer 1, so that the sensing portion 3 has comparatively weak mechanical strength. The sensing portion 3 provides the exposed portion and the movable portion.

On the backside surface 1b of the wafer 1, which is opposite to the foreside surface 1a, a concavity 1c is formed with using an anisotropic etching method so that the concavity 1c is disposed on the sensing portion 3. Therefore, both sides of the sensing portion 3 are exposed from the foreside and backside surfaces 1a, 1b of the wafer 1. A dicing line, i.e., a scribing line D shown in FIG. 1A is to divide each acceleration sensor 100, respectively. The wafer 1 is to be diced and divided into a plurality of chips 100 with using a water jet laser scribing method. The water jet laser scribing method uses a laser beam radiation for dicing the wafer 1 at the scribing line D together with spraying cooing water on the foreside surface 1a of the wafer 1. Thus, the wafer 1 is to be divided into the chips 100 in a dicing process described later.

As shown in FIG. 1B, the first adhesion sheet 2 is the passivation cap. The planer shape of the first adhesion sheet 2 has a mesh structure, and less absorbs the laser beam compared with the wafer 1, i.e., the absorption coefficient of the laser beam absorbed in the first adhesion sheet 2 is smaller than that in the wafer 1. Specifically, the first adhesion sheet 2 includes a base sheet 2a and an adhesion sheet 2b. The base sheet 2a less absorbs the laser beam compared with the wafer 1, and has the mesh structure. The adhesion sheet 2b is disposed on one surface of the base sheet 2a. The adhesion sheet 2b is to be attached to the foreside surface 1a of the wafer 1.

The base sheet 2a is made of poly-imide resin and the like, which hardly absorbs the laser beam having a predetermined wavelength. Here, the wavelength of the laser is in a range between an infrared and an ultraviolet. It is preferred that the laser beam is an infrared laser beam. That is because the infrared laser beam such as YAG (i.e., yttrium-aluminium-garnet) laser beam or semiconductor laser beam is easily collimated or focused. Preferably, the base sheet 2a is made of material that is substantially transparent to the laser beam, or that does not melt and fuses by heat generated with the laser beam. For example, the base sheet 2a is made of glass, glass fiber, ceramics, or metal. Here, when the base sheet 2a is made of metal such as stainless steel, the mesh can be formed with using a flat woven method. Further, when the base sheet 2a is made of nickel, the mesh can be formed with using an electroforming method.

The adhesion sheet 2b is made of ultraviolet (i.e., UV) curable adhesive material such as an acrylic resin. When the adhesion sheet 2b is irradiated with the UV light, the adhesive strength of the adhesion sheet 2b is reduced. The thickness of the base sheet 2a is, for example, about 80 $\mu$m and the thickness of the adhesion sheet 2b is 10 $\mu$m. The adhesion sheet 2b can be only attached to a mesh portion of the base sheet 2a, i.e., the adhesion sheet has also a mesh structure. Preferably, the adhesion sheet 2b has a continuous structure instead of the mesh structure, so that an opening of the mesh portion of the base sheet 2a is covered with the adhesion sheet 2b.

The first adhesion sheet 2 is formed as follows. The base sheet 2a having the mesh structure is formed with using a press working process. Then, the adhesion sheet 2b is adhered to the base sheet 2a with an adhesive applied on the one surface of the base sheet 2a, or with a sheet type adhesive attached on the one surface of the base sheet 2a. The first adhesion sheet 2 is mounted on a frame 10 having a ring shape. The frame 10 is made of metallic material having rigidity such as stainless steel. Specifically, the adhesion sheet 2b of the first adhesion sheet 2 is attached to the frame 10. A hollow portion of the frame 10 is equal to or larger than the wafer 1, and the thickness of the frame 10 is almost equal to that of the wafer 1.

The mesh structure of the base sheet 2a has the following characteristics. The opening of the mesh structure has a lower limit, which a silicon scrape, i.e., silicon chippage does not block the opening in a case where the wafer 1 is cut with the laser beam. For example, the maximum silicon scrape is about the same size of the width of a dicing cut portion 14, so that the opening is preferably equal to or larger than the width of the dicing cut portion 14. Further, the cooling water can pass through the opening smoothly. Furthermore, the opening is preferably equal to or larger than the diameter of the water flow of the cooling water. However, the opening can be smaller than the diameter of the water flow as long as the cooling water flows through the opening smoothly.

The opening of the mesh structure has an upper limit, which is equal to or smaller than the dimensions of the chip 100. That is because each chip 100 may not remain to be one body when the opening is larger than the dimensions of the chip 100.

The mesh has a line width. As the line width of the mesh becomes thinner, the design freedom of the mesh, i.e. the material composing the mesh (i.e., the base sheet 2a)

becomes larger. That is because the laser beam is not prevented with the mesh (e.g., the laser beam is not diffracted or scattered with the mesh) in a case where the line width of the mesh is thin. However, the mesh necessitates the sufficient line width not to be cut or bent with the cooling water, i.e., the high pressure jet water. Further, the mesh necessitates the sufficient line width not to be melted by heat generated with the laser beam absorption in the mesh. However, the line width of the mesh has the upper limit in such a manner that the water flows smoothly through the mesh, and a laser beam guiding effect works sufficiently.

The thickness of the mesh, i.e., the base sheet $2a$ is preferably thin so as to enhance the laser beam guiding effect. Here, the laser beam guiding effect is such that the laser beam is collimated when the laser beam passes through the water flow of the cooling water. However, the mesh necessitates the sufficient thickness not to be cut or bent with the cooling water, and not to be melted by heat generated with the laser beam absorption in the mesh. Further, the thickness of the mesh has the upper limit in such a manner that the water flows smoothly through the mesh, and the laser beam guiding effect works sufficiently.

2. UV Radiation Process

Figure 1C:
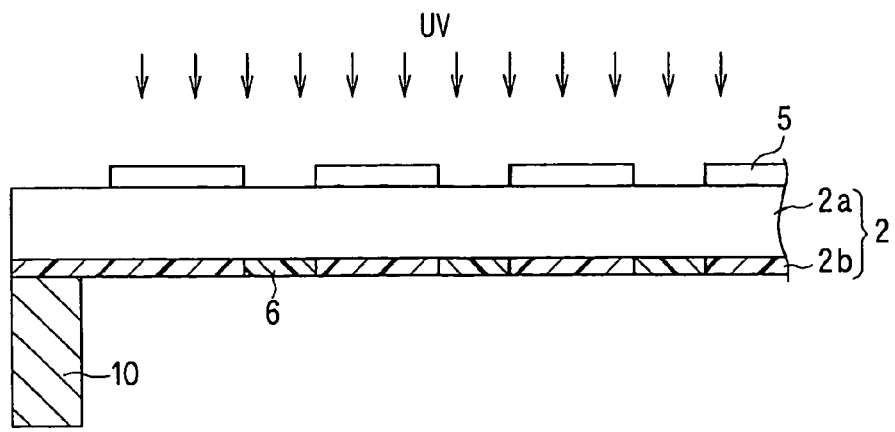

Next, as shown in FIG. 1C, part of the adhesion sheet $2b$ is irradiated with the UV light so that the adhesive force of the first adhesion sheet 2 is selectively reduced. Specifically, the base sheet $2a$ of the first adhesion sheet 2 is covered with a mask 5. The mask 5 has an opening corresponding to the sensing portion 3. Then, the UV light having a predetermined wavelength, for example, shorter than 365 nm, is irradiated on the base sheet $2a$ with the mask 5. Thus, part of the adhesion sheet $2b$ irradiated with the UV light is selectively cured, i.e., hardened. Accordingly, the adhesive force of the irradiated adhesion sheet $2b$ is reduced selectively. Thus, a hardened portion 6 of the adhesion sheet $2b$ is formed. The hardened portion 6 is to face the sensing portion 3, and has a small adhesive force compared with the other portion of the adhesion sheet $2b$.

3. Positioning Process

Successively, the wafer 1 is positioned to the first adhesion sheet 2 such that the hardened portion 6 of the adhesion sheet $2b$ of the first adhesion sheet 2 faces the foreside surface $1a$ of the sensing portion 3 of the wafer 1. In this process, the base sheet $2a$ of the first adhesion sheet 2 remains to be covered with the mask 5. The positioning of the wafer 1 is performed such that a marker (not shown) disposed on the mask 5 coincides with another marker (not shown) disposed on the wafer 1.

It is preferred that the adhesion sheet $2b$ includes a material that reacts with the UV light so as to color a certain color, so that the positioning of the wafer 1 is easily and accurately performed with using the colored adhesion sheet $2b$. For example, an additive, which is a coloring matter for coloring in accordance with the UV light, is added into the adhesion sheet $2b$, so that part of the adhesion sheet $2b$ is colored when the UV light is irradiated on part of the adhesion sheet $2b$ disposed on the opening of the mask 5. Thus, the colored adhesion sheet $2b$ can be visible, so that the wafer 1 is positioned directly to the first adhesion sheet 2, i.e., the marker of the wafer 1 is not necessitated to coincide with the marker of the first adhesion sheet 2. Thus, the accuracy of the positioning is improved.

4. Second Bonding Process

Figure 2A:
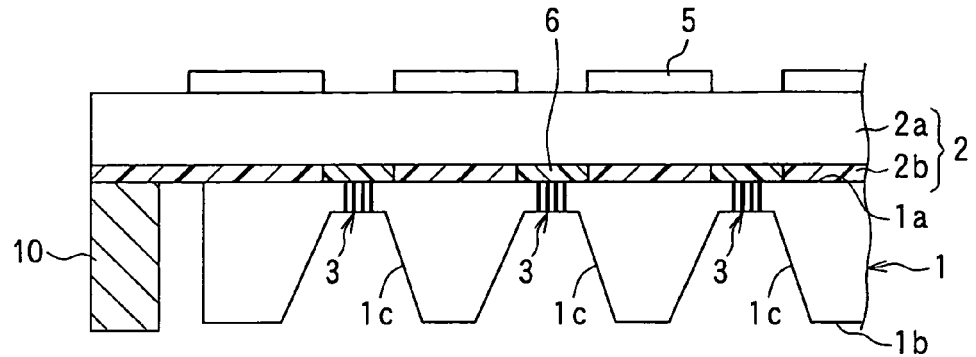
Figure 2B:
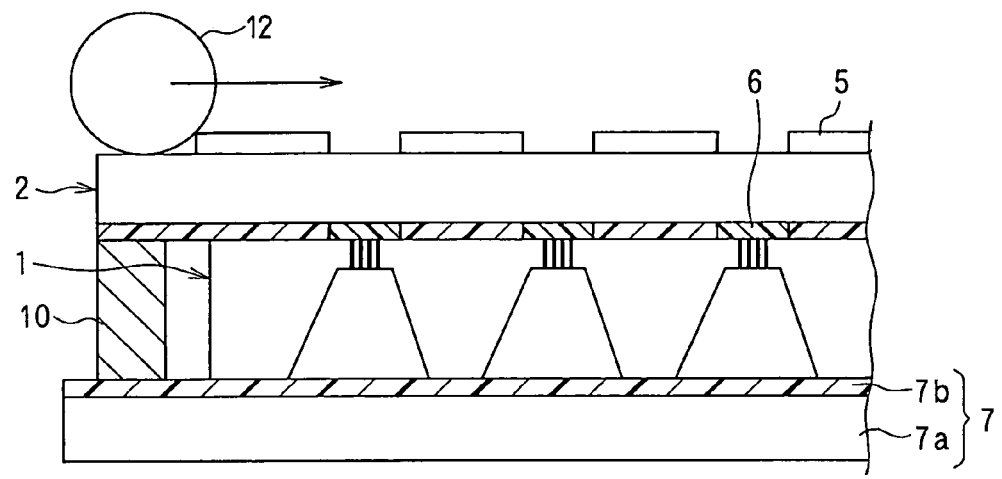
Figure 2C:
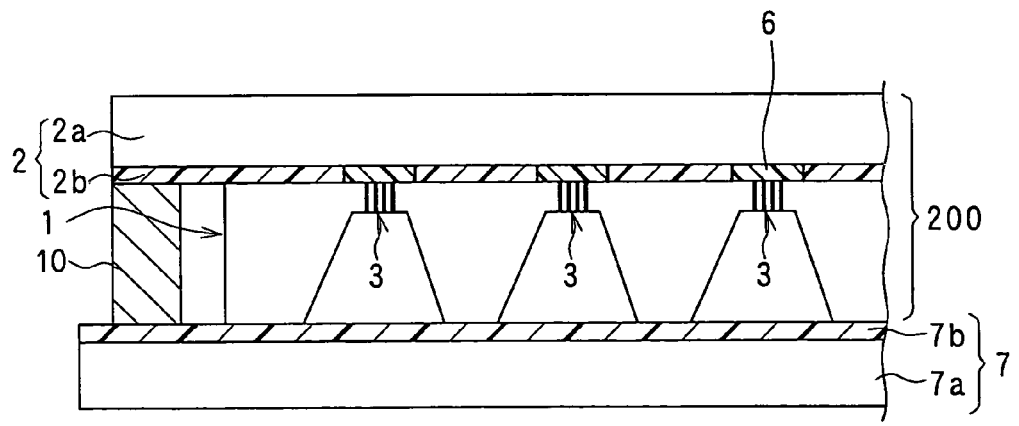

As shown in FIG. 2B, the second adhesion sheet 7 is bonded on the backside surface $1b$ of the wafer 1. The second adhesion sheet 7 includes a base sheet $7a$ having a mesh structure and an adhesion sheet $7b$ disposed on the base sheet $7a$. The second adhesion sheet 7 works for fixing each chip 100 when the first adhesion sheet 2 is removed from the wafer 1. In some cases, the device 200 may include no second adhesion sheet 7.

The adhesion sheet $7b$ of the second adhesion sheet 7 is bonded to the backside surface $1b$ of the wafer 1. After that, the mask 5 is pressurized so that the first and second adhesion sheets 2, 7 are press-adhered to the wafer 1. Here, the mask 5 remains to be bonded to the first adhesion sheet 2, and the opening of the mask 5 remains to coincide with the sensing portion 3. Specifically, a roller 12 pressurizes on the mask 5 so as to press-bond the first and second adhesion sheets 2, 7 to the wafer 1.

Therefore, the adhesion sheet $2b$ of the first adhesion sheet 2, specifically, part of the adhesion sheet $2b$ except for the hardened portion 6, and the adhesion sheet of $7b$ of the second adhesion sheet 7 is bonded strongly to the wafer 1, i.e., the adhesion strength therebetween is improved. Therefore, the sensing portion 3 is protected from intrusion of water from a bonding portion between the first or second adhesion sheet 2, 7 and the wafer 1 when or after the wafer 1 is diced with using cooling water. Thus, yielding percentage of the chips 100 is improved.

The length of the roller 12 corresponds to the length of the mask 5, so that the roller 12 does not step into the opening of the mask 5. Therefore, the opening of the mask 5 works as a clearance of the sensing portion 3, so that the sensing portion 3 is not directly pressurized with the roller 12. Therefore, the sensing portion 5 is not broken in this roller press process. After the first and second adhesion sheets 2, 7 are press-bonded to the wafer 1, the mask 5 is removed from the wafer 1. Thus, the semiconductor device 200 is completed.

The device 200 includes the wafer 1 with the sensing portion 3 as an exposed portion and the first adhesion sheet 2 as a removable passivation cap for covering the sensing portion 3 on the wafer 1. The device 200 can be diced with using the water jet laser dicing method. Here, the first adhesion sheet 2 less absorbs the laser beam compared with the wafer 1, i.e., the absorption coefficient of the laser beam absorbed in the first adhesion sheet 2 is smaller than that in the wafer 1, and has the base sheet $2a$ and the adhesion sheet $2b$. The base sheet $2a$ is a flat plate, and the adhesion sheet $2b$ of the first adhesion sheet 2 has the hardened portion 6 with low adhesion strength, which faces the sensing portion 3 and selectively reduced with the adhesive force. This is because the sensing portion 3 does not adhere to the adhesive material of the adhesion sheet $2b$.

Accordingly, in a case where the first adhesion sheet 2 has a dome portion facing the sensing portion 3 so that the dome of the first adhesion sheet 2 does not adhere to the sensing portion 3, the device 200 does not necessitate the hardened portion 6. In this case, the adhesion sheet $2b$ is not selectively and partially hardened, i.e., partially reduced with the adhesive force. Thus, the device 200 can have the dome portion instead of the hardened portion 6.

5. Dicing Process

Figure 3A:
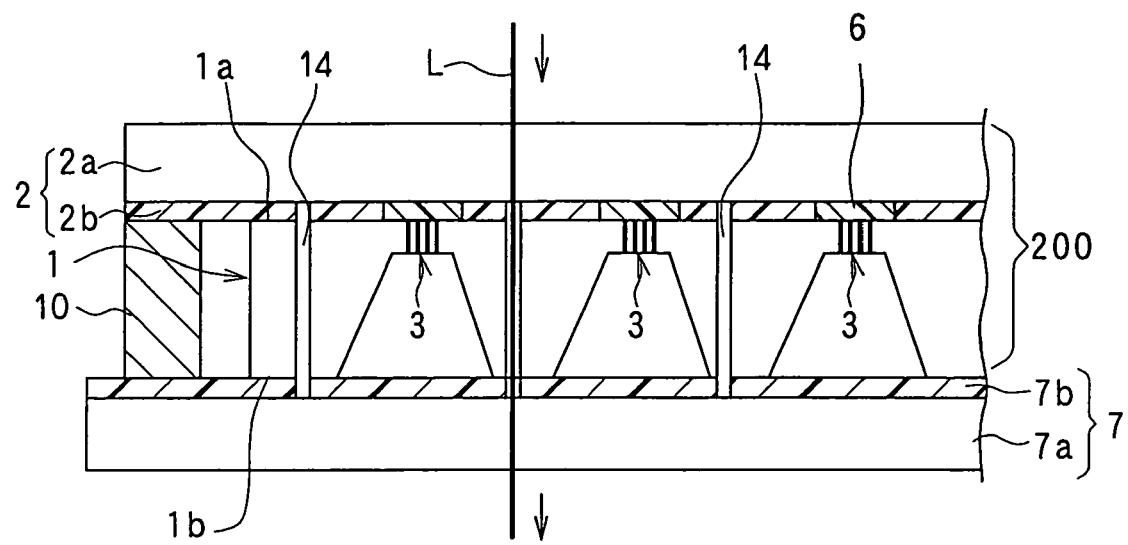
Figure 5:
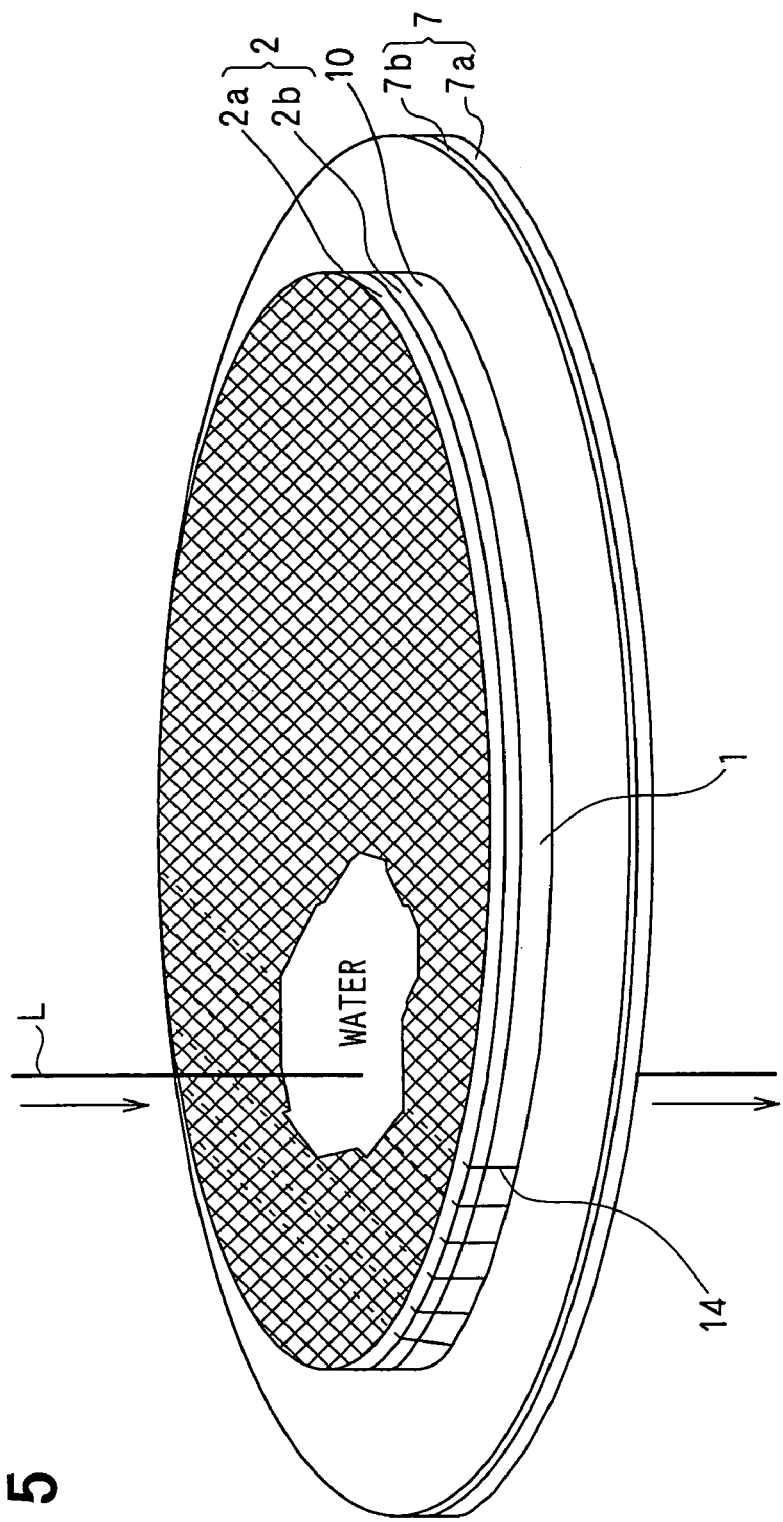
FIG. 5 is a perspective view showing the semiconductor device according to the first embodiment.

Next, the wafer 1 is diced with using the water jet laser dicing method, as shown in FIG. 3A. Specifically, the cooling water is jetted toward the foreside surface $1a$ of the wafer 1, and the laser beam is irradiated on the foreside surface $1a$ of the wafer 1, so that the wafer 1 is diced, i.e., cut into the chips 100 along with the scribing line D. For example, a dicing cut portion 14 is formed in the wafer 1, as shown in FIG. 3A. As shown in FIG. 5, the laser beam L is introduced into the water flow of the cooling water flowing from the foreside surface $1a$ of the wafer 1 to the backside surface 1b of the wafer 1, which has the first and second adhesion sheets 2, 7 disposed on both sides of the wafer 1. Here, it is preferred that the laser beam L is perpendicular to the wafer 1, and the water flow is parallel to the laser beam L. That is because the laser beam is collimated by the laser beam guiding effect until the laser passes through the wafer 1 in a case where the laser beam L passes through the water flow. Therefore, a taper angle of a cutting surface of the wafer 1 is perpendicular to the laser beam.

In the above process, the laser beam L is irradiated on the wafer 1 through the opening portion of the mesh of the first adhesion sheet 2 as the passivation cap, so that the wafer 1 is melt and cut by absorbing the laser beam L. Further, the adhesion sheet 2b of the first adhesion sheet 2, which is bonded and adhered to the wafer 1, also sublimes and is cut by heat generated in case of cutting the wafer 1. On the other hand, since the base sheet 2a having the mesh structure is made of poly-imide resin, the base sheet 2a has high heat resistance and less absorbs the laser beam L compared with the wafer 1. Further, the base sheet 2a is cooled with the cooling water. Therefore, the base sheet 2a is not cut with the laser beam L. Thus, the first adhesion sheet 2 remains to be one body because of the base sheet 2a, which is not cut into the chips.

Further, although the adhesion sheet 7b of the second adhesion sheet 7 sublimes and is cut by the heat, the base sheet 7a of the second adhesion sheet 7 is not cut so that the second adhesion sheet 7 remains to be one body.

Here, the mesh structure of the base sheet 2a of the first adhesion sheet 2 is determined to have a certain opening of the mesh so that the pressure of the cooling water applied to the wafer 1 can be controlled, i.e., the pressure of the cooling water can be reduced. Thus, the sensing portion 3 of the wafer 1 is protected appropriately during the dicing process. Specifically, the opening of the mesh structure is determined such that the base sheet 2a can pass the cooling water to the adhesion sheet 2b, so that the cooling water passes through the adhesion sheet 2b and reaches the wafer 1 when the adhesion sheet 2b is diced and cut with the laser beam L. Further, the opening is determined such that the pressure of the cooling water after passing through the first adhesion sheet 2 is smaller than that before passing through the first adhesion sheet 2. That is, the pressure of the cooling water hitting on the wafer 1 is smaller than that hitting on the first adhesion sheet 2.

Thus, although the device 200 includes the wafer 1 with the sensing portion 3 as an exposed portion and the first adhesion sheet 2 as the passivation cap, which is removable and disposed on the wafer 1, the passivation cap is not cut into the chips so that it is no need for bonding each passivation cap after dicing process.

Preferably, the adhesion sheet 2b has a continuous structure instead of the mesh structure, so that an opening of the mesh portion of the base sheet 2a is covered with the adhesion sheet 2b. This is because the adhesion sheet 2b protects the sensing portion 3 of each chip 100 from penetration of the cooling water from the opening of the mesh structure of the base sheet 2a of the first adhesion sheet 2. Specifically, since the chip 100 is the acceleration sensor 100 having the movable electrode and the fixed electrode (i.e., movable and fixed portions) for detecting a capacitance change therebetween, if the cooling water penetrates into the sensing portion 3, the movable electrode may stick to the fixed electrode. Accordingly, in a case where the chip 100 with the adhesion sheet 2b has the movable portion and the exposed portion, the cooling water does not penetrate into the sensing portion 3 so that the movable portion does not stick to the fixed portion.

6. Removing Process

Figure 3B:
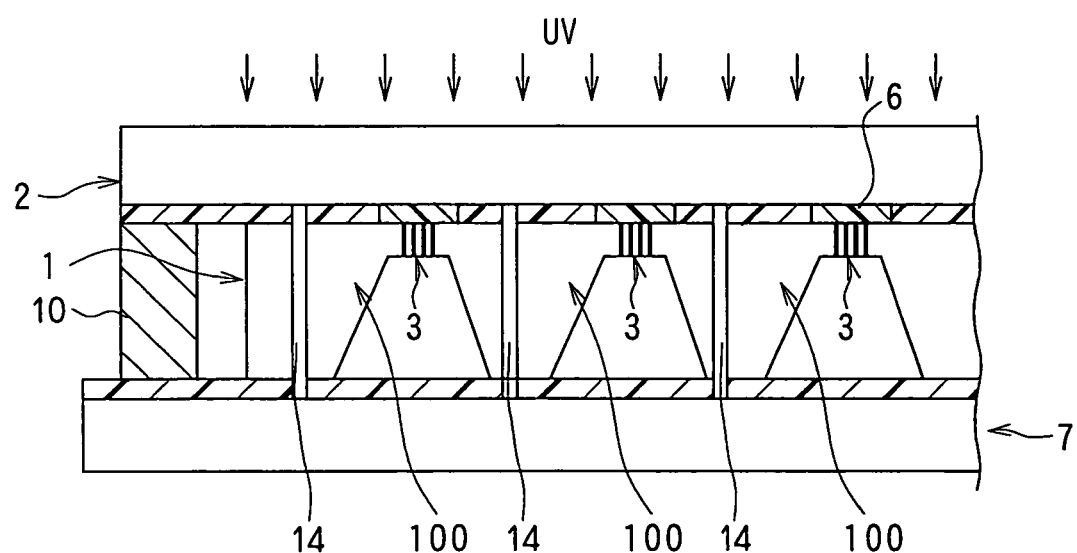

FIG. 3B shows the device 200 after the dicing process. As shown in FIG. 3B, the wafer 1 is diced and divided into the chips 100 at the dicing cut portion 14. However, the first and second adhesion sheets 2, 7 remain to be one body. To remove the first adhesion sheet 2 from the chip 100 easily, the UV light is irradiated on whole area of the surface of the first adhesion sheet 2. Therefore, the adhesive force of the adhesion sheet 2b is reduced. Thus, the first adhesion sheet 2 as one body is removed easily from the chips 100. In this case, each chip 100 is bonded to the second adhesion sheet 7, so that the chip 100 does not dissect out after removing the first adhesion sheet 2.

Figure 4:
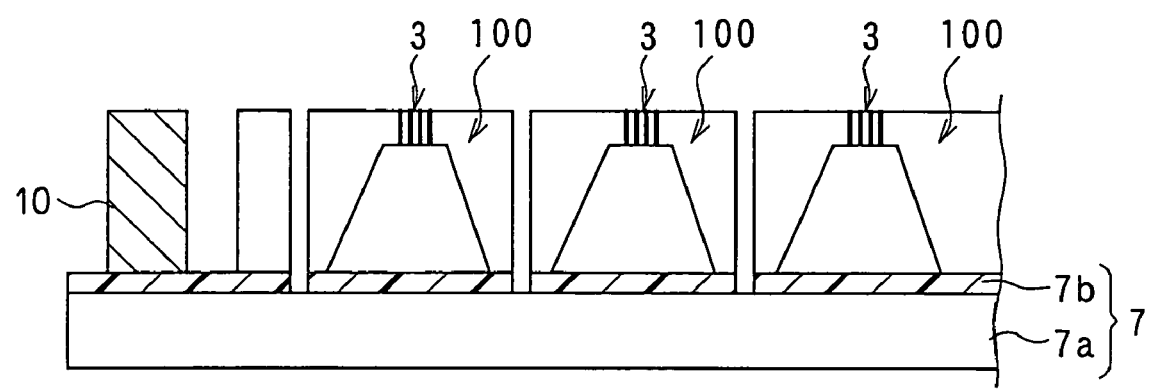

Thus, the device 200 without the first adhesion sheet 2 is shown in FIG. 4. Each acceleration sensor 100 is bonded to the second adhesion sheet 7, so that the sensor 100 is removed from the second adhesion sheet 7 for using the sensor 100. In this case, the UV light is irradiated on whole area of the surface of the second adhesion sheet 7 so as to remove the second adhesion sheet 7 from the chip 100 easily. Thus, the adhesive force of the adhesion sheet 7b is reduced, so that the second adhesion sheet 7 as one body is removed easily from the chips 100.

The semiconductor device 200 having a plurality of chips 100 on the wafer 1 and having the removable passivation cap 2 for protecting the sensing portion 3 is manufactured with the above-described method. The method has no bonding process for bonding each passivation cap after dicing.

Second Embodiment

A semiconductor device 300 according to a second embodiment of the present invention is manufactured with the following process shown in FIGS. 6A–7B. In a case where the opening of the mesh structure of the base sheet 2a of the first adhesion sheet 2 is larger, it is difficult to cover the opening of the mesh structure with the adhesion sheet 2b of the first adhesion sheet 2. If the opening of the mesh structure is not sufficiently covered with the adhesion sheet 2b, the cooling water may penetrate into the sensing portion 3 during the dicing process, so that the movable portion sticks to the other portion.

In view of the above problem, the device 300 further includes a passivation sheet 8 disposed between the foreside surface 1a of the wafer 1 and the first adhesion sheet 2. The passivation sheet 8 works for preventing the cooling water from penetrating into the sensing portion 3, and is to be cut with the laser beam. The detailed process is described as follows.

1. First Bonding Process

Figure 6A:
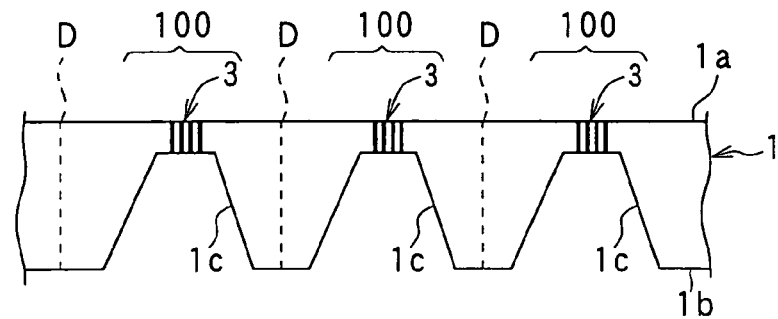
FIGS. 6A–7B are cross-sectional views explaining a method for manufacturing a semiconductor device according to a second embodiment of the present invention.
Figure 6B:
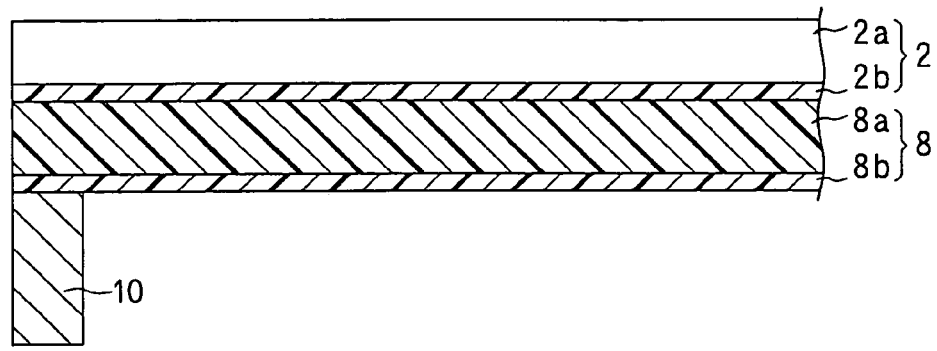

As shown in FIGS. 6A and 6B, the semiconductor wafer 1 and the first adhesion sheet 2 are prepared. The passivation sheet 8 is formed on the first adhesion sheet 2 so that the passivation sheet 8 is disposed between the first adhesion sheet 2 and the frame 10. Specifically, the passivation sheet 8 includes a base sheet 8a and an adhesion sheet 8b disposed on one surface of the base sheet 8a. The adhesion sheet 8b is bonded to the wafer 1, i.e., the base sheet 8a of the passivation sheet 8 is bonded to the adhesion sheet 2b of the first adhesion sheet 2. The base sheet 8a has no opening, and is a continuous sheet. The base sheet 8a is made of polyolefin resin and the like. The adhesion sheet 8b is made of acrylic resin and the like. Thus, the base sheet 8a and the adhesion sheet 8b are to be sublimed and cut by the heat in case of cutting the wafer 1 in the dicing process, so that the passivation sheet 8 is cut.

2. UV Radiation Process

Figure 6C:
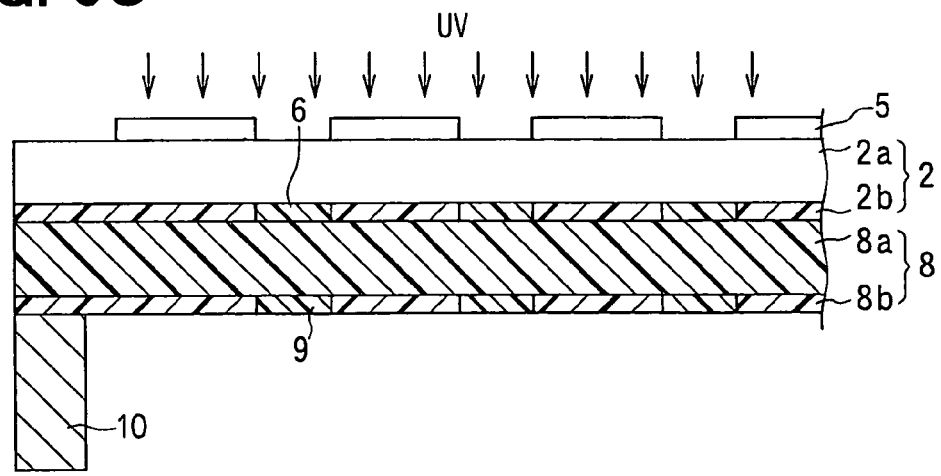

As shown in FIG. 6C, the UV light is irradiated on part of the adhesion sheet 2b with using the mask 5 so that the adhesive force of the first adhesion sheet 2 is selectively reduced. Thus, the hardened portion 6 of the adhesion sheet 2b is formed. At this time, a hardened portion 9 of the adhesion sheet 8b is also formed at a predetermined portion, which corresponds to the hardened portion 6 of the adhesion sheet 2b of the first adhesion sheet 2.

3. Positioning and Second Bonding Process

Figure 7A:
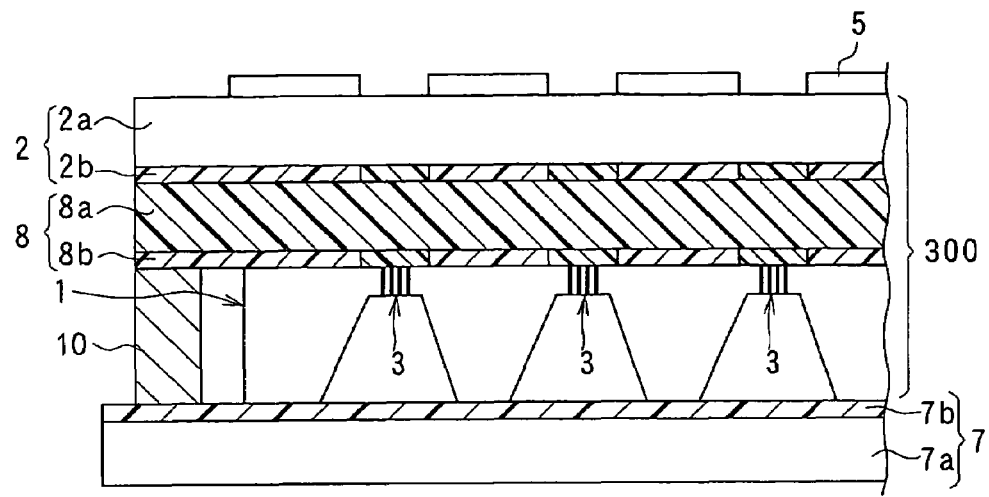

Successively, the wafer 1 is positioned to the first adhesion sheet 2 such that the hardened portion 6 of the adhesion sheet 2b of the first adhesion sheet 2 faces the foreside surface 1a of the sensing portion 3 of the wafer 1, as shown in FIG. 7A. That is, the sensing portion 3 faces the hardened portion 6 of the adhesion sheet 2b. In this process, the base sheet 2a of the first adhesion sheet 2a remains to be covered with the mask 5.

Then, the second adhesion sheet 7 is bonded on the backside surface 1b of the wafer 1. The roller 12 pressurizes on the mask 5 so as to press-bond the first and second adhesion sheets 2, 7 to both sides of the wafer 1. Thus, the semiconductor device 300 is completed.

5. Dicing Process

Figure 7B:
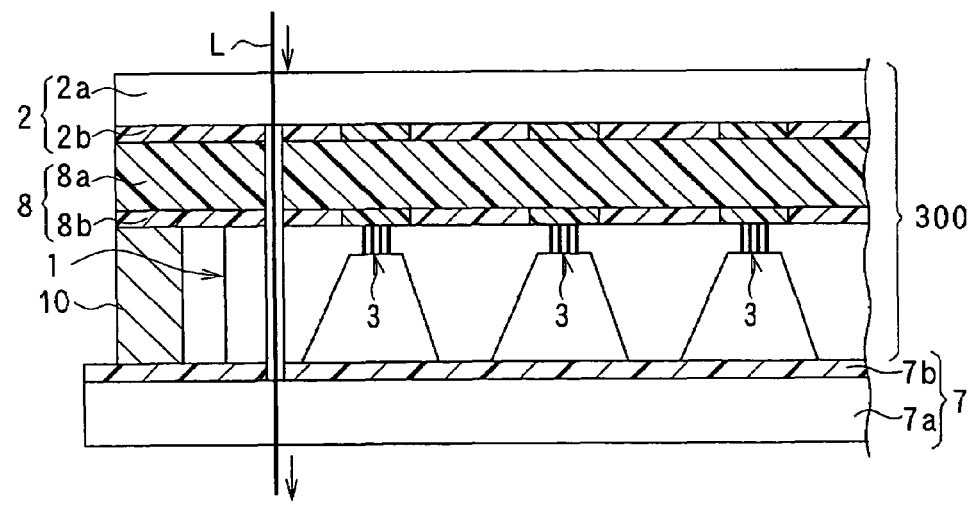

After the mask 5 is removed, the wafer 1 is diced with using the water jet laser scribing method, as shown in FIG. 7B. At this time, the passivation sheet 8 is sublimed and cut with the heat generated with the laser beam in case of cutting the wafer 1. Thus, the wafer 1, the passivation sheet 8, and each adhesion sheet 2b, 7b of the first and second adhesion sheets 2, 7 are cut into the chips 100. However, the first and second adhesion sheets 2, 7 remain to be one body, because each base sheet 2a, 7a of the first and second adhesion sheets 2, 7 is not cut.

6. Removing Process

After dicing the wafer 1, the first adhesion sheet 2 is removed from the chips 100. To remove the first adhesion sheet 2 from the chip 100 easily, the UV light is irradiated on whole area of the surface of the first adhesion sheet 2. Therefore, the adhesive force of the adhesion sheet 2b is reduced. Thus, the first adhesion sheet 2 as one body is removed easily from the chips 100.

At this time, the adhesive force of the adhesion sheet 8b of the passivation sheet 8 is also reduced, so that the passivation sheet 8 together with the first adhesion sheet 2 is easily removed. In this case, each chip 100 is bonded to the second adhesion sheet 7, so that the chip 100 does not dissect out after removing the first adhesion sheet 2 and the passivation sheet 8.

Thus, the device 300 without the first adhesion sheet 2 and the passivation sheet 8 is similar to the device 200 shown in FIG. 4. Each acceleration sensor 100 is bonded to the second adhesion sheet 7, so that the sensor 100 is removed from the second adhesion sheet 7 for using the sensor 100. In this case, the UV light is irradiated on whole area of the surface of the second adhesion sheet 7 so as to remove the second adhesion sheet 7 from the chip 100 easily. Thus, the adhesive force of the adhesion sheet 7b is reduced, so that the second adhesion sheet 7 as one body is removed easily from the chips 100.

The semiconductor device 300 having a plurality of chips 100 on the wafer 1 and having the removable passivation cap 2 for protecting the sensing portion 3 is manufactured with the above-described method. The method has no bonding process for bonding each passivation cap after dicing.

Further, even if the opening of the mesh structure of the base sheet 2a of the first adhesion sheet 2 is large so that the opening of the mesh structure is not sufficiently covered with the adhesion sheet 2b, the passivation sheet 8 can prevent the cooling water from penetrating into the sensing portion 3 from the opening of the mesh structure of the base sheet 2a.

(Modification)

Although the opening of the mesh structure of the base sheet 2a of the first adhesion sheet 2 is covered with the adhesion sheet 2b of the first adhesion sheet 2 or the passivation sheet 8, the opening of the mesh can be covered with a coating material inserting into the opening of the mesh structure except for the scribing line D, i.e., a portion to be the dicing cut portion 14.

The coating material is, for example, poly-imide resin, acrylic resin and the like. This coating material is applied so as to fill into a predetermined opening of the mesh structure of the base sheet 2a. The coating material can prevent the cooling water from penetrating into the sensing portion 3 from the opening of the mesh structure of the base sheet 2a.

Preferably, the opening of the mesh structure corresponding to the sensing portion 3 is covered with the coating material, so that the cooling water is prevented effectively from penetrating into the sensing portion 3.

Although the second adhesion sheet 7 has the same construction as that of the first adhesion sheet 2, the second adhesion sheet 7 can be formed of another construction, as long as each chip 100 is fixed on the second adhesion sheet 7 after removing the first adhesion sheet 2 from the chips 100. For example, when the base sheet 7a of the second adhesion sheet 7 is made of another material that is not cut with the laser beam in the dicing process, the base sheet 7a may not have the mesh structure.

Although the chip 100 is the acceleration sensor, the chip 100 can be another chip having a movable portion or a low mechanical strength member. For example, the chip 100 can be a yaw rate sensor, a pressure sensor having a diaphragm as an exposed portion, or a device having an air bridge wiring.

Such changes and modifications are to be understood as being within the scope of the present invention as defined by the appended claims.

What is claimed is:

1. A semiconductor device comprising:

a semiconductor wafer having a weak portion; and a removable passivation cap disposed on the wafer for covering the weak portion, wherein the passivation cap has an absorption coefficient of a laser beam, which is smaller than that of the wafer, and wherein the cap has a capability of passing water therethrough.

2. The device according to claim 1, wherein the weak portion includes a movable portion or an exposed portion, and wherein the cap has a mesh structure so that pressure of water after passing through the cap is smaller than that before passing through the cap in a case where the water jets on the wafer with the cap.

3. The device according to claim 2, wherein the cap adheres to the wafer at a contact surface of the wafer, wherein the mesh structure has a capability of passing the water through the mesh to jet on the contact surface, and wherein the pressure of the water around the weak portion is smaller than that around a surface of the cap.

4. The device according to claim 2,
wherein the wafer has a capability of being cut with a laser beam irradiation together with jetting the water on the wafer.

5. The device according to claim 4,
wherein the laser beam is parallel to a jetting water in case of the laser beam irradiation, and the laser beam is perpendicular to the wafer, and
wherein the laser beam passes through the jetting water.

6. The device according to claim 5,
wherein the laser beam is a yttrium-aluminium-garnet laser beam or a semiconductor laser beam.

7. The device according to claim 1,
wherein the passivation cap includes a base sheet and an adhesion sheet,
wherein the base sheet has the absorption coefficient of the laser beam, which is smaller than that of the wafer, and has the mesh structure, and
wherein the adhesion sheet has both sides, one side being adhered to the base sheet and the other side being adhered to the wafer.

8. The device according to claim 7,
wherein the base sheet is made of resin, glass, glass fiber, ceramics or metal.

9. The device according to claim 8,
wherein the base sheet is made of flat woven stainless steel or electroformed nickel.

10. The device according to claim 7,
wherein the mesh structure of the base sheet has a plurality of openings, and
wherein the adhesion sheet covers the openings of the base sheet.

11. The device according to claim 10,
wherein the wafer includes a plurality of chips, each of which includes the weak portion, and has a predetermined size,
wherein the opening has another predetermined size, which is equal to or smaller than the size of the chip, and
wherein the wafer further includes a dicing cut portion having further another predetermined size, which is equal to or smaller than the size of the opening.

12. The device according to claim 11,
wherein the wafer has a capability of dividing into the chips at the dicing cut portion.

13. The device according to claim 10,
wherein the adhesion sheet covers the openings of the base sheet in such a manner that the opening is filled with a coating material composing the adhesion sheet.

14. The device according to claim 7,
wherein the base sheet is a flat plate, and
wherein the adhesion sheet has a portion, which faces the weak portion and has a small adhesive force so that the adhesive force of the portion is smaller than that of the other portion of the adhesion sheet.

15. The device according to claim 14,
wherein the adhesion sheet is made of an ultraviolet light curable material, an adhesive force of which becomes small in a case where the ultraviolet light is irradiated on the material.

16. The device according to claim 15,
wherein the portion of the adhesion sheet is a hardened portion in a case where the ultraviolet light is irradiated on the portion.

17. The device according to claim 7,
wherein the base sheet is made of poly-imide resin and the like, and the adhesion sheet is made of acrylic resin and the like.

18. The device according to claim 1, further comprising:
a passivation sheet disposed between the wafer and the cap,
wherein the passivation sheet has a capability of being cut with the laser beam and protecting the water from penetrating into the wafer.

19. The device according to claim 11,
wherein the mesh structure of the base sheet has a plurality of openings, and
wherein the adhesion sheet covers the openings of the base sheet except for the dicing cut portion in such a manner that the opening is filled with a coating material composing the adhesion sheet.

20. The device according to claim 7,
wherein the mesh structure of the base sheet has a plurality of openings, and
wherein the adhesion sheet covers part of the openings of the base sheet in such a manner that the opening is filled with a coating material composing the adhesion sheet, the part of the opening corresponding to the weak portion.

* * * * *